United States Patent [19]
Kim

[11] Patent Number: 5,408,134
[45] Date of Patent: Apr. 18, 1995

[54] SUB-STEP PULSE GENERATING CIRCUIT USING THE PERIOD OF A STEP PULSE

[75] Inventor: Jik Kim, Suwon, Rep. of Korea

[73] Assignee: SamSung Electronics Co., Ltd., Suwon, Rep. of Korea

[21] Appl. No.: 977,799

[22] Filed: Nov. 17, 1992

[30] Foreign Application Priority Data

Nov. 22, 1991 [KR] Rep. of Korea .............. 20905/1991

[51] Int. Cl.⁶ .................... H03K 5/22; H03K 5/04; H03K 7/00
[52] U.S. Cl. .................................... 327/116; 327/37; 327/176
[58] Field of Search ............... 307/234, 271, 517, 518, 307/602, 603, 522, 523, 261, 265; 328/15, 115

[56] References Cited

U.S. PATENT DOCUMENTS

| | | | |
|---|---|---|---|
| 3,828,258 | 8/1974 | Hills et al. ............ | 307/234 |
| 3,958,182 | 5/1976 | Sauthier . | |
| 4,214,270 | 7/1980 | Morito ................. | 307/234 |
| 4,233,525 | 11/1980 | Takahashi et al. ..... | 307/234 |
| 4,629,915 | 12/1986 | Suzuki et al. ........ | 307/265 |
| 4,728,816 | 3/1988 | Wike . | |
| 4,881,040 | 11/1989 | Vaughn . | |
| 5,008,571 | 4/1991 | Rudish ................. | 307/271 |
| 5,086,237 | 2/1992 | Matsumoto . | |

Primary Examiner—Timothy P. Callahan
Assistant Examiner—Toan Tran
Attorney, Agent, or Firm—Robert E. Bushnell

[57] ABSTRACT

A circuit for generating a sub-step pulse control signal using a step pulse in a step pulse generating circuit of a floppy disk driver included in a system such a personal computer. The sub-step pulse control signal generating circuit receives a step pulse and a step pulse enable signal and checks the period of the step pulse. When the period of the step pulse is shorter than a set time of a timer, the sub-step pulse control signal generating circuit produces a sub-step pulse having a fast generating time, and when the period of the step pulse is longer than the set time, a sub-step pulse having a slow generating time is produced. Thus, the generating time of the sub-step pulse is automatically adjusted.

20 Claims, 3 Drawing Sheets

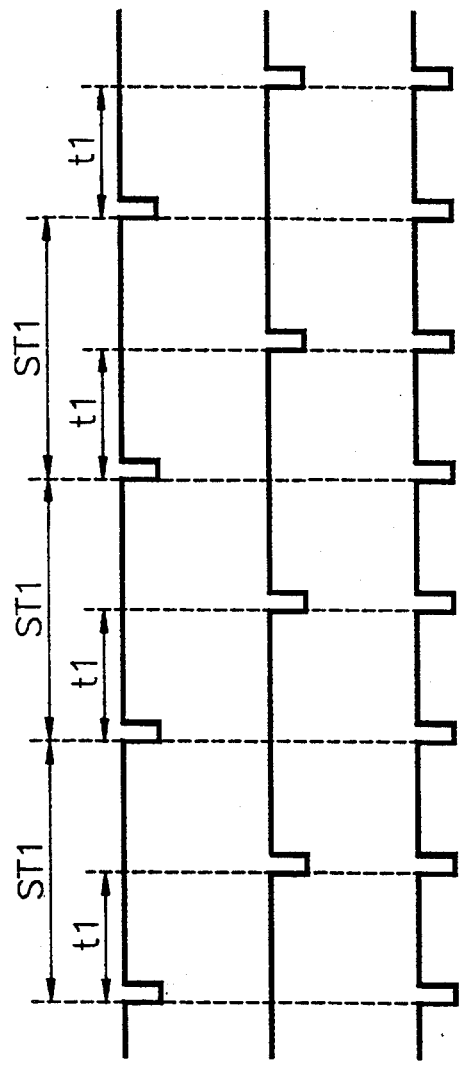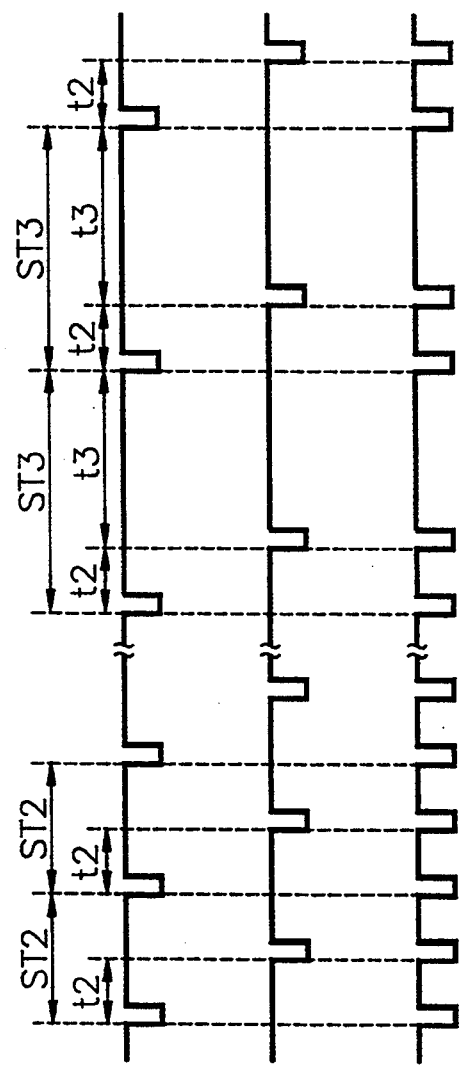
FIG. 2A  FIG. 2B  FIG. 2C  FIG. 2D  FIG. 2E  FIG. 2F
(PRIOR ART)

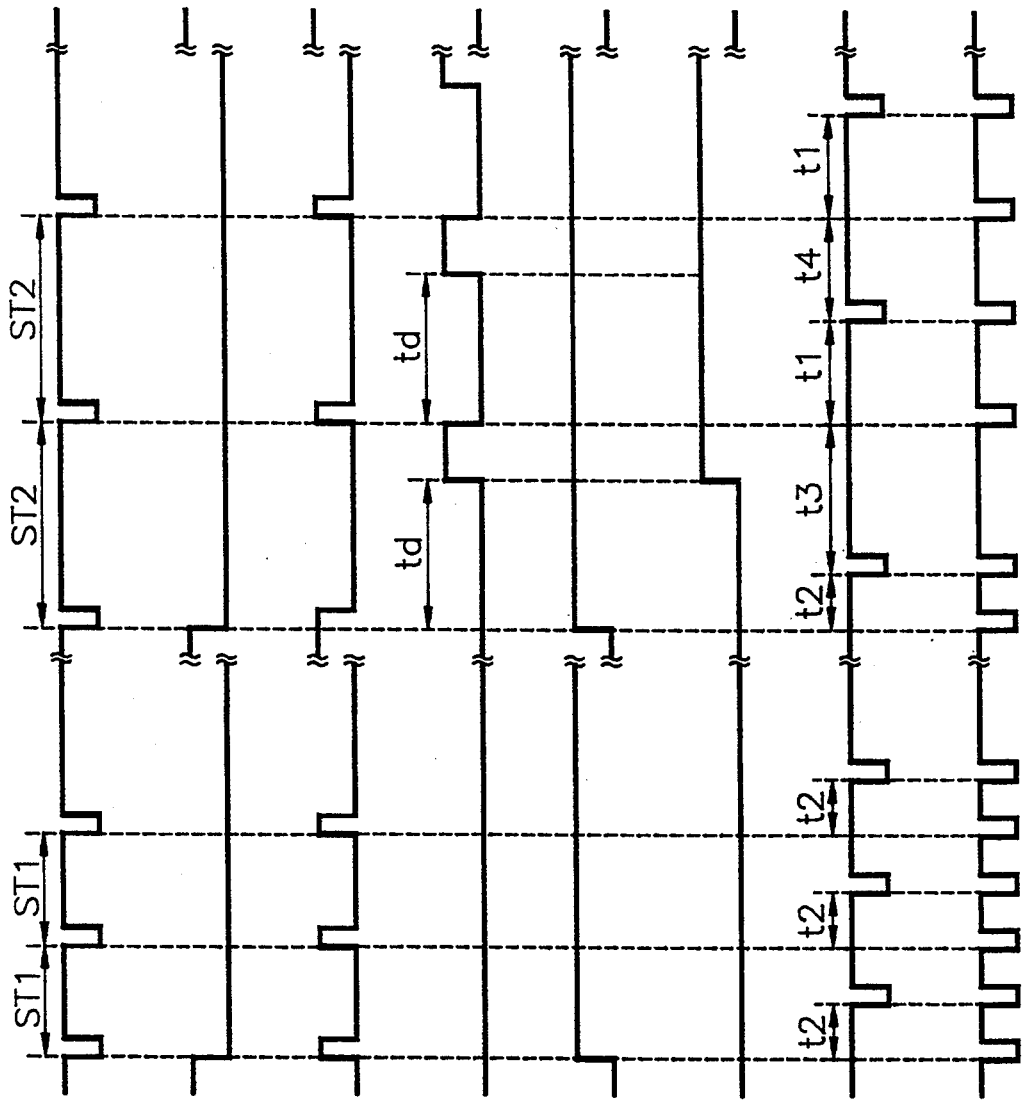

SUB-STEP PULSE GENERATING CIRCUIT USING THE PERIOD OF A STEP PULSE

BACKGROUND OF THE INVENTION

The present invention relates to a step pulse generating circuit of a floppy disk drive installed in a system such as a personal computer, and more particularly to a circuit for generating a sub-step pulse control signal using a step pulse.

A general floppy disk drive (FDD) has a stepping circuit for generating phase variations twice when one step pulse is applied and, in this case, a second step pulse, generated in the FDD so as to produce the second phase variation, is called a sub-step pulse. A system such as a personal computer, a word processor and the like, having the FDD generates a series of step pulses for driving a stepping motor of the FDD. Then the FDD receives the step pulses and produces a final step pulse varying the phase of the stepping motor together with the sub-step pulse generated therein.

Referring to FIG. 1, a conventional step pulse generating circuit has a sub-step pulse control signal generating circuit 1, a sub-step pulse generating circuit 2 and a final step pulse generating circuit 3. Since the sub-step pulse generating circuit 2 is well known to the art, the construction thereof is omitted. The sub-step pulse control signal generating circuit 1 includes a first switch S1 connected to a power voltage Vcc through a first resistor R1 and a second switch S2 connected to a ground voltage Vss through a second resistor R2. As shown, a sub-step pulse control signal generated from the sub-step pulse control signal generating circuit 1 is determined by the switch S1 or S2 installed on a PCB (printed circuit board). If the first switch S1 is set to "ON" state, the sub-step pulse control signal of logic "high" level is produced, and if the second switch S2 is set to "ON" state, the sub-step pulse control signal of logic "low" level is generated. Thus, a pulse interval triggering a sub-step pulse produced from the sub-step pulse generating circuit 2 has no relation to a step pulse and is influenced by times t1 and t2 as shown in FIGS. 2A through 2F. The times t1 and t2 are determined by the construction of the switches S1 and S2.

FIGS. 2A to 2C show pulse waveforms when the first switch S1 is set to "ON" state. That is, the sub-step pulse control signal is in logic "high" level, and the sub-step pulse, shown in FIG. 2B, is generated with an interval of time t1. At this instance, the period ST1 of the step pulse, shown in FIG. 2A must be longer than time t1.

FIGS. 2D through 2F show pulse wave forms when the second switch S2 is set to "ON" state. Here, the sub-step pulse control signal is in logic "low" level, and the generating time of the sub-step pulse, shown in FIG. 2E, becomes t2. Further, the periods ST2 and ST3 of the step pulse, shown in FIG. 2D must be longer than time t2. Usually, the times t1 and t2 are set to 3 ms (millisecond) and 1.5 ms, respectively. Therefore, the circuit of FIG. 1 has disadvantages in that the period of the step pulse should be longer than that of the sub-step pulse. Furthermore, if the step pulse of the period ST3 is applied, the final step pulse, shown in FIG. 2D is repeated with times t2 and t3. Here, since time t3 is relatively long, the stepping motor generates a great deal of oscillation when driven, and as a result, noise occurs.

SUMMARY OF THE INVENTION

Therefore, it is an object of the present invention to provide a sub-step pulse control signal generating circuit for reducing the noise of the stepping motor which may be generated by the variations of the period of a step pulse or sub-step pulse, and to stably drive the stepping motor.

It is another object of the present invention to provide a sub-step pulse control signal generating circuit for automatically controlling the time from the input of a step pulse to the generation of a sub-step pulse.

According to one aspect of the present invention, in a step pulse generating circuit having two inputs and a step pulse and a step pulse enable signal, the sub-step pulse control signal generating circuit receives the step pulse and the step pulse enable signal and checks the period of the step pulse. When the period of the step pulse is shorter than a set time of a timer, the sub-step pulse control signal generating circuit produces a sub-step pulse control signal controlling generation of a sub-step pulse having a fast generating time, and when the period of the step pulse is longer than the set time, a sub-step pulse having a slow generating time is produced. Thus, the generating time of the sub-step pulse is automatically adjusted.

BRIEF DESCRIPTION OF THE DRAWINGS

For a more complete understanding of the present invention, reference should be made to the following detailed description, in conjunction with the attached drawings, in which:

FIGS. 2A to 2F are waveforms showing pulses at each part of the circuit of FIG. 1;

FIGS. 4A to 4H are waveforms showing pulses at each part of the circuit of FIG. 3.

DETAILED DESCRIPTION OF THE PREFERRED EMBODIMENT

Figure 1:
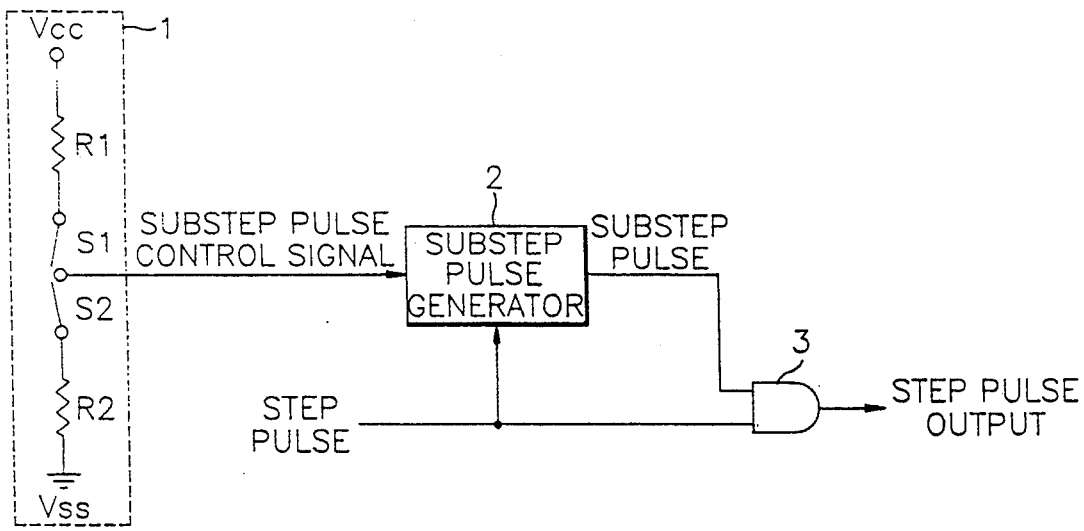
FIG. 1 is a block diagram of a conventional step pulse generating circuit.
Figure 3:
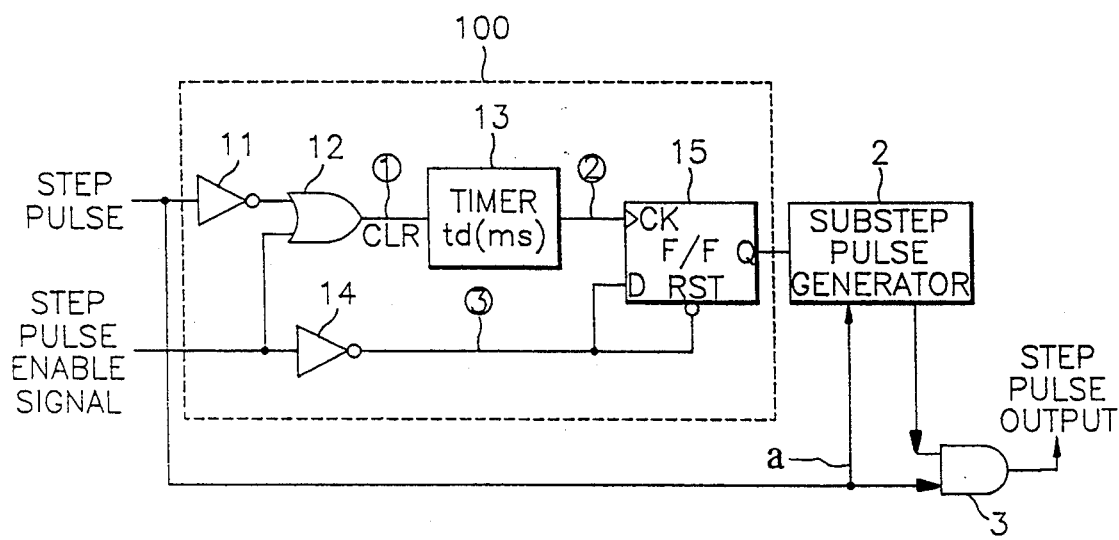
FIG. 3 is a block diagram of a step pulse generating circuit according to the present invention.

Referring to FIG. 3, a sub-step pulse control signal generating circuit 100 includes first and second inverters 11 and 14, an OR gate 12, a timer 13, and a flip-flop 15. A step pulse, show in FIG. 4A is applied through the first inverter 11 to the OR gate 12. The output, FIG. 4C, of the OR gate 12 is applied to the clear input of the timer 13. A step pulse enable signal, FIG. 4B is applied to the OR gate 12, and through the second inverter 14 to the data input and the reset input of the flip-flop 15, the output shown in FIG. 4C. The output of the timer 13, FIG 4D, is applied to the clock input of the flip-flop 15. In this case, the step pulse enable signal is generated from the FDD in order to supply a power voltage to the stepping motor. If there are no step pulses, the step pulse enable signal is maintained at logic "high" level, and once a step pulse is applied, the step pulse enable signal is lowered to logic "low" level. If the step pulse is continuously supplied, the step pulse enable signal is continuously maintained at logic "low" level, and if a given time elapses after a final step pulse is applied, the step pulse enable signal is again raised to logic "high" level. A sub-step pulse control signal, see FIG. 4F, generated from the flip-flop 15 is supplied to a sub-step pulse generating circuit 2 and controls the generating time of a sub-step pulse, shown in FIG. 4G.

The operation of the circuit of FIG. 3 will now be described in detail with reference to FIGS. 4A to 4H. In FIG. 3, the time td set by the timer 13 is about 4.5 ms which is longer than the period ST1 (3.0 ms) of the step pulse and shorter than the period ST2 (6.0 ms) shown in FIG. 4A. If a power source is supplied to the step pulse generating circuit, the step pulse enable signal, FIG. 4B, of logic "low" level is applied to the reset input of the flip-flop 15 and the sub-step pulse control signal, FIG. 4F, is set to logic "low" level. At this time, even if the step pulse having the period ST1 is applied, the output of the timer 13 is maintained at logic "low" level since time td is longer than the period ST1. Hence, the sub-step pulse control signal of logic "low" level controls the sub-step pulse so, FIG. 4G, as to have the generating time of relatively short time t2 (usually, 1.5 ms). Meanwhile, if the step pulse having the period ST2 is applied, the output of the timer 13 is raised to logic "high" level from logic "low" level after time td and this signal is supplied to the clock input of the flip-flop 15, to raise the sub-step pulse control signal to logic "high" level. The sub-step pulse control signal of logic "high" level controls the sub-step pulse generating circuit 2 to produce the sub-step pulse having generating time t1 (usually, 3.0 ms). Since a first sub-step pulse is generated prior to time td, the sub-step pulse is generated with the lapse of time t2 after the step pulse is applied, and the next sub-step pulses are produced after time t1. In more detail, in order to determine the period of the final step pulse, FIG. 4H, at least two step pulses must be applied, and therefore, the step pulse is considered to have a short period until the period of the step pulse is checked.

When the step pulse having the period ST2 is applied, in the conventional circuit, the final step pulse with an irregular period is repeated, while in the illustrated circuit embodying the present invention, the final step pulse of nearly the same period is generated. Therefore, the stepping motor is stably driven and the noise is greatly reduced. The time td of the timer 13 can be adjusted depending on the period of the step pulse and the step pulse enable signal.

As described above, since the sub-step pulse control signal generating circuit according to the present invention can automatically control the generating time of the sub-step pulse by detecting the period of the step pulse, even if the step pulse generated from a system having the FDD is varied, there is no necessity for converting the switch from the exterior. In addition, the stepping motor is stably driven and the noise can be greatly suppressed.

The foregoing description shows only a preferred embodiment of the present invention. Various modifications may be apparent to those skilled in the art without departing from the spirit and scope of the present invention which is only limited by the appended claims. Therefore, the embodiment shown and described is only illustrative, not restrictive.

I claim:

1. A sub-step pulse control signal generating circuit for use in a step pulse generating circuit, comprising:
   means for receiving a step pulse and a step pulse enable signal;
   a timer responsive to an output of said receiving means for setting a set time; and
   means for comparing the period of said step pulse with the set time of the timer to generate a sub-step pulse control signal for controlling sub-step pulse generating means to produce a sub-step pulse having a first generating time when a period of said step pulse is shorter than the set time of said timer and to produce said sub-step pulse having a second generating time longer than said first generating time when said period of said step pulse is longer than the set time of said timer.

2. A sub-step pulse control signal generating circuit for use in a step pulse generating circuit connected to receive a step pulse and a step pulse enable signal, comprising:
   a first inverter;
   an OR circuit receiving an inverted step pulse through said first inverter and said step pulse enable signal;
   a timer with a clear input receiving the output of said OR circuit;
   a second inverter; and
   a flip-flop circuit with a clock input receiving the output of said timer and a data input and a reset input receiving an inverted step pulse enable signal through said second inverter, to generate a sub-step pulse control signal.

3. An apparatus for generating a series of first step pulses to control a stepper motor, said apparatus comprising:
   sub-step pulse generating means for generating a series of sub-step pulses in response to a sub-step pulse control signal and a series of second step pulses received from an external source;
   first logic means for generating the series of first step pulses in response to said series of sub-step pulses and said series of second step pulses received from said external source; and
   sub-step pulse control means receiving said series of second step pulses and an enable signal, for controlling said sub-step pulse generating means to generate said series of sub-step pulses of a first time interval after receipt of said series of second step pulses when a period of said series of second step pulses is shorter than a reference time period, and for controlling said sub-step pulse generating means to generate said series of sub-step pulses of a second time interval longer than said first time interval after receipt of said series of second step pulses when said period of said series of second step pulses is longer than said reference time period, by generating said sub-step pulse control signal.

4. The apparatus of claim 3, wherein said sub-step pulse control means comprises:
   second logic means for logically combining said series of second step pulses and a step pulse enable signal, said step pulse enable signal supplying a power voltage to the stepper motor;
   timing means responsive to an output signal from said second logic means, for generating an intermediate signal having a first state if the period of said series of second step pulses is shorter than said reference time period, and for generating said intermediate signal having a second state if the period of said series of second step pulses is longer than said reference time period; and
   flip-flop means for generating said sub-step pulse control signal in response to said intermediate signal and said step pulse enable signal.

5. The apparatus as claimed in claim 4, further comprising:

a first inverter for generating an inverted series of second step pulses by inverting said series of second step pulses prior to receipt by said second logic means;

a second inverter for inverting said step pulse enable signal to generate an inverted signal;

said flip-flop means having a clock input terminal coupled to receive said intermediate signal, and a data input and reset input coupled to receive said inverted signal.

6. The apparatus as claimed in claim 4, wherein said step pulse enable signal has a first state while said series of second step pulses are applied to said second logic means, and said step pulse enable signal has a second state if said series of second step pulses are not applied to said second logic means.

7. The apparatus as claimed in claim 4, wherein said timing means generates said intermediate signal having said first state prior to checking a time difference between two successive pulses of said series of second step pulses.

8. An apparatus for generating a series of first step pulses to control a stepper motor, said apparatus comprising:

first logic means for generating a logic signal in response to a series of second step pulses and a step pulse enable signal, said step pulse enable signal supplying power to the stepper motor;

timing means for generating an intermediate signal having a first state when a time interval between successive pulses of said logic signal is less than a given time period, and for generating said intermediate signal having a second state if said time interval between said successive pulses of said logic signal is greater than said given time period;

means for receiving said intermediate signal as a clock pulse signal, and for delaying output of said step pulse enable signal for one clock pulse of said clock pulse signal, to generate a sub-step pulse control signal;

sub-step pulse generating means for generating a series of sub-step pulses in response to said sub-step pulse control signal and said series of second step pulses; and second logic means for logically combining said series of sub-step pulses and said series of second step pulses, to generate said series of first step pulses.

9. The apparatus as claimed in claim 8, wherein:
said first logic means comprises an OR gate; and
said second logic means comprises an AND gate.

10. A method of generating a first series of step pulses to control a stepper motor, said method comprising:

logically combining a second series of step pulses received from an external source and a step pulse enable signal from a floppy disk drive, to generate a first intermediate signal;

making a determination whether an interval between successive pulses of said first intermediate signal is one of greater than and less than a given time interval;

generating a second intermediate signal having a first state and a second state in dependence upon said determination;

logically combining said second intermediate signal and said step pulse enable signal, to generate a sub-step pulse control generating a series of sub-step pulses in response to said sub-step pulse control signal and said second series of step pulses, said sub-step pulses being delayed by one of a first time interval and second time interval based on said determination; and logically combining said series of sub-step pulses and said second series of step pulses, to generate said first series of step pulses.

11. The method as claimed in claim 10, wherein said step of logically combining said second intermediate signal and said step pulse enable signal comprises:

inverting said step pulse enable signal to generate an inverted signal;

receiving said second intermediate signal at a clock input of a flip-flop; and receiving said inverted signal at a data input and a reset input of said flip-flop.

12. A step pulse generating circuit, comprising:

control means coupled to receive initial step pulses and an enabling signal, for generating sub-step pulse control signal upon making a comparison between a period of said initial step pulses and a preset period;

sub-step pulse generator means for generating sub-step pulses in response to said sub-step pulse control signal and said initial step pulses; and means for generating final step pulses for driving a stepping motor in dependence upon logical combination of said sub-step pulses and said initial step pulses.

13. The step pulse generating circuit as claimed in claim 12, wherein said control means comprises:

first inverter means for providing inverted initial step pulses by inverting said initial step pulses;

second inverter means for providing an inverted enabling signal by inverting said enabling signal;

logic gate means for providing logic pulses by logically combining said inverted initial step pulses with said enabling signal;

timer means for setting the preset period and for comparing said preset period with the period of said initial step pulses in dependence upon said logic pulses to generate a timing signal; and flip-flop means having a clock terminal coupled to receive said timing signal and data and reset terminals coupled to receive said inverted enabling signal, for generating said sub-step pulse control signal to enable said sub-step pulse generator means to generate said sub-step pulses having a first generating time when the period of said initial step pulses is shorter than the preset period, and said sub-step pulses having a second generating time slower than said first generating time when the period of said initial step pulses is longer than the preset period.

14. The step pulse generating circuit as claimed in claim 13, wherein said final step pulses generating means is comprised of a AND gate.

15. The step pulse generating circuit as claimed in claim 12, wherein said control means comprises:

logic gate means for providing logic pulses in dependence upon said initial step pulses and said enabling signal;

timer means for setting the preset period to enable comparison with the period of said initial step pulses in dependence upon said logic pulses to generate a timing signal; and flip-flop means for generating said sub-step pulse control signal in dependence upon said timing signal and said enabling signal, said sub-step pulse control signal enabling said sub-step pulse generator means to generate said sub-step pulses having a first generating time when the period of said initial step pulses is shorter than the preset period, and said sub-step pulses having a second generating time slower than said first generating time when the period of said initial step pulses is longer than the preset period.

16. The step pulse generating circuit as claimed in claim 15, wherein said final step pulses generating means is comprised of an AND gate.

17. The apparatus as claimed in claim 3, wherein said sub-step pulse control means comprises:
    logic gate means for providing logic pulses in dependence upon said series of second step pulses and a step pulse enable signal;
    timer means for setting the reference time period and for comparing said reference time period with the period of said series of second step pulses in dependence upon said logic pulses to generate a timing signal; and
    flip-flop means for generating said sub-step pulse control signal in dependence upon said timing signal and said step pulse enable signal, said sub-step pulse control signal enabling said sub-step pulse generator means to generate said sub-step pulses having said first time interval representative of a fast generating time for said sub-step pulses when the period of said second step pulses is shorter than said reference time period, and said sub-step pulses having said second time interval representative of a slow generating time for said sub-step pulses when the period of said series of second step pulses is longer than said reference time period.

18. The apparatus as claimed in claim 3, wherein said first logic means is comprised of an AND gate.

19. A sub-step pulse control signal generating circuit for use in step pulse generating circuit, comprising:
    first inverter means coupled to receive initial step pulses, for providing inverted step pulses;
    second inverter means coupled to receive a step pulse enable signal, for providing s an inverted enable signal;
    logic means for providing logic pulses by logically combining said inverted step pulses with said step pulse enable signal;
    timer means for setting a preset period and for enabling a comparison said preset period with a period of said initial step pulses in dependence upon said logic pulses to generate a timing signal; and
    means responsive to said timing signal and said inverted enable signal, for generating a sub-step pulse control signal for controlling generation of sub-step pulses having a first generating time when the period of said initial step pulses is shorter than the preset period, and said sub-step pulses having a second generating time slower than said first generating time when the period of said initial step pulses is longer than the preset period.

20. The sub-step pulse control signal generating circuit as claimed in claim 19, wherein said logic means is a OR gate coupled to receive said inverted step pulses and said step pulse enable signal, and said sub-step pulse control signal generating means is a flip-flop having a clock terminal coupled to receive said timing signal, data and reset terminals coupled to receive said inverted enable signal, and an output terminal for providing said sub-step pulse control signal.

* * * * *